US 8,161,320 B2

(12) United States Patent
Kim et al.

(10) Patent No.: US 8,161,320 B2
(45) Date of Patent: Apr. 17, 2012

(54) APPARATUS, MEMORY DEVICE CONTROLLER AND METHOD OF CONTROLLING A MEMORY DEVICE

(75) Inventors: Jin-Hyuk Kim, Seoul (KR); Yang-Sup Lee, Seoul (KR); Young-Gon Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1084 days.

(21) Appl. No.: 11/606,900

(22) Filed: Dec. 1, 2006

(65) Prior Publication Data

US 2008/0155317 A1    Jun. 26, 2008

(30) Foreign Application Priority Data

Oct. 2, 2006  (KR) ........................ 10-2006-0097154

(51) Int. Cl.
G06F 11/00        (2006.01)
(52) U.S. Cl. ......................................................... 714/6.1
(58) Field of Classification Search ................ 714/8, 6.1, 714/6.11
See application file for complete search history.

(56) References Cited

U.S. PATENT DOCUMENTS

| 5,740,349 A * | 4/1998 | Hasbun et al. ..................... 714/8 |
| 2003/0163663 A1 * | 8/2003 | Aasheim et al. ............. 711/202 |
| 2003/0165076 A1 * | 9/2003 | Gorobets et al. ............. 365/200 |
| 2005/0182892 A1 * | 8/2005 | Nakanishi et al. ............. 711/103 |
| 2006/0031710 A1 * | 2/2006 | Jo ..................................... 714/5 |
| 2006/0059297 A1 * | 3/2006 | Nakanishi et al. ............. 711/103 |
| 2006/0072394 A1 * | 4/2006 | Blacquiere et al. .......... 369/47.1 |
| 2007/0283428 A1 * | 12/2007 | Ma et al. ............................ 726/9 |
| 2008/0082736 A1 * | 4/2008 | Chow et al. .................... 711/103 |
| 2011/0066837 A1 * | 3/2011 | Lee et al. ........................... 713/2 |

FOREIGN PATENT DOCUMENTS

| JP | 2003-045196 | 2/2003 |
| JP | 2004-265162 | 9/2004 |
| KR | 1999-55972 | 7/1999 |
| KR | 10-457812 | 11/2004 |
| KR | 1020060006554 | 1/2006 |

OTHER PUBLICATIONS

Korean Office Action dated Nov. 28, 2007.

* cited by examiner

*Primary Examiner* — Scott Baderman
*Assistant Examiner* — Yair Leibovich
(74) *Attorney, Agent, or Firm* — Harness, Dickey & Pierce, P.L.C.

(57) ABSTRACT

An apparatus, memory device controller and method of controlling a memory device are provided. The example apparatus may include a bad block bitmap referencing unit configured to obtain bad block information from a bad block bitmap based on a given memory address, the given memory address being one of a logical memory address and a physical memory address corresponding to the logical memory address, the bad block information indicating whether a given memory block corresponding to the given memory address is a bad block and a memory mapping unit configured to obtain the physical memory address corresponding to the logical memory address, and configured to obtain a reserved physical memory address corresponding to the physical memory address if the bad block information indicates that the given memory block is a bad block. In an example, the apparatus may be embodied as a memory device controller including a flash translation layer (FTL).

12 Claims, 7 Drawing Sheets

APPARATUS, MEMORY DEVICE CONTROLLER AND METHOD OF CONTROLLING A MEMORY DEVICE

PRIORITY STATEMENT

This application claims priority under 35 USC §119 to Korean Patent Application No. 2006-97154 filed on Oct. 2, 2006, in the Korean Intellectual Property Office, the disclosure of which is incorporated herein in its entirety by reference.

BACKGROUND OF THE INVENTION

1. Field of the Invention

Example embodiments of the present invention relate generally to an apparatus, memory device controller and method of controlling a memory device, and more particularly to an apparatus, memory device controller and method of controlling a method device based on selectively providing a reserved or redundant memory address in place of a physical memory address for a bad block.

2. Description of the Related Art

Flash memory devices may include a random access memory (RAM) and a read-only memory (ROM). Some flash memory devices may be configured to have attributes associated with both RAMs and ROMs. For example, a conventional flash memory device may be configured to re-write over old data, as in a RAM, and also to maintain stored data without a continuous power supply, as in a ROM or "solid-state" memory device.

A conventional flash memory device may include a plurality of memory blocks, with each of the plurality of memory blocks including a plurality of pages. Generally, a flash memory device may perform an erase operation in units of memory blocks and may perform read and write operations in units of a page.

Because conventional flash memory devices may not perform an in-place update on pages in which the data is already written, the flash memory may allocate a new page, which is erased in advance, and may write the data on the new page.

Therefore, the flash memory device may include a block mapping table for mapping a logical memory address (e.g., used by a software application) into a physical memory address used in the flash memory device. A flash memory device controller for controlling the flash memory device may use the block mapping table to perform a mapping operation between the logical memory address and the physical memory address.

Memory cells in a conventional flash memory device may typically be capable of performing a limited number of read and/or write operations. If the number of read and/or write operations exceeds a threshold, or alternatively, if a given memory block includes one or more memory cells having a physical defect, the memory block may not operate correctly. A defective memory block may be referred to as a bad block or an invalid block.

The flash memory device may include a reserved or redundant block for replacing the bad block if the bad block is detected. Therefore, if the physical memory address translated based on the logical memory address corresponds to the bad block, the flash memory device controller may remap the translated physical memory address to a new physical memory address corresponding to the redundant block.

SUMMARY OF THE INVENTION

An example embodiment of the present invention is directed to a method for controlling access to a memory device, including obtaining a physical memory address corresponding to a logical memory address, obtaining bad block information from a bad block bitmap based on a given memory address, the given memory address being one of the logical memory address and the physical memory address, the bad block information indicating whether a given memory block corresponding to the given memory address is a bad block and obtaining a reserved physical memory address corresponding to the physical memory address if the bad block information indicates that the given memory block is a bad block.

Another example embodiment of the present invention is directed to an apparatus for controlling access to a memory device, including a bad block bitmap referencing unit configured to obtain bad block information from a bad block bitmap based on a given memory address, the given memory address being one of a logical memory address and a physical memory address corresponding to the logical memory address, the bad block information indicating whether a given memory block corresponding to the given memory address is a bad block and a memory mapping unit configured to obtain the physical memory address corresponding to the logical memory address, and configured to obtain a reserved physical memory address corresponding to the physical memory address if the bad block information indicates that the given memory block is a bad block.

In an example, the apparatus may be embodied as a memory device controller including a flash translation layer (FTL).

Another example embodiment of the present invention is directed to an apparatus for controlling access to a memory device capable of translating a logical memory address into a physical memory address.

Another example embodiment of the present invention is directed to a memory device controller capable of translating a logical memory address into a physical memory address.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
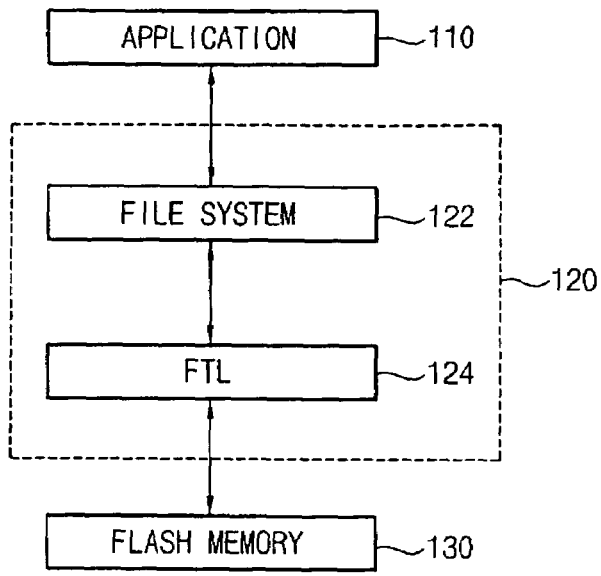
FIG. 1 is a diagram illustrating a flash memory system according to an example embodiment of the present invention.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a flash memory system according to an example embodiment of the present invention.

In the example embodiment of FIG. 1, the flash memory system may include a flash memory device controller 120, an application 110 (e.g., a software application) and a flash memory device 130. The flash memory device controller 120 may include a file system 122 and a flash translation layer (FTL) 124.

In the example embodiment of FIG. 1, the file system 122 may be configured with an interface allowing the application 110 to write data to the flash memory device 130. The file system 122 may provide an interface between the application 110 and the FTL 124 such that the application 110 may write data irrespective of a type of the flash memory device 130 (e.g., a ROM, a RAM, etc.).

In the example embodiment of FIG. 1, the FTL 124 may provide an interface between the file system 122 and the flash memory device 130 such that the file system 122 may write data received from the application 110 into the flash memory device 130. An example operation of the FTL 124 will be described in greater detail below.

Figure 2:
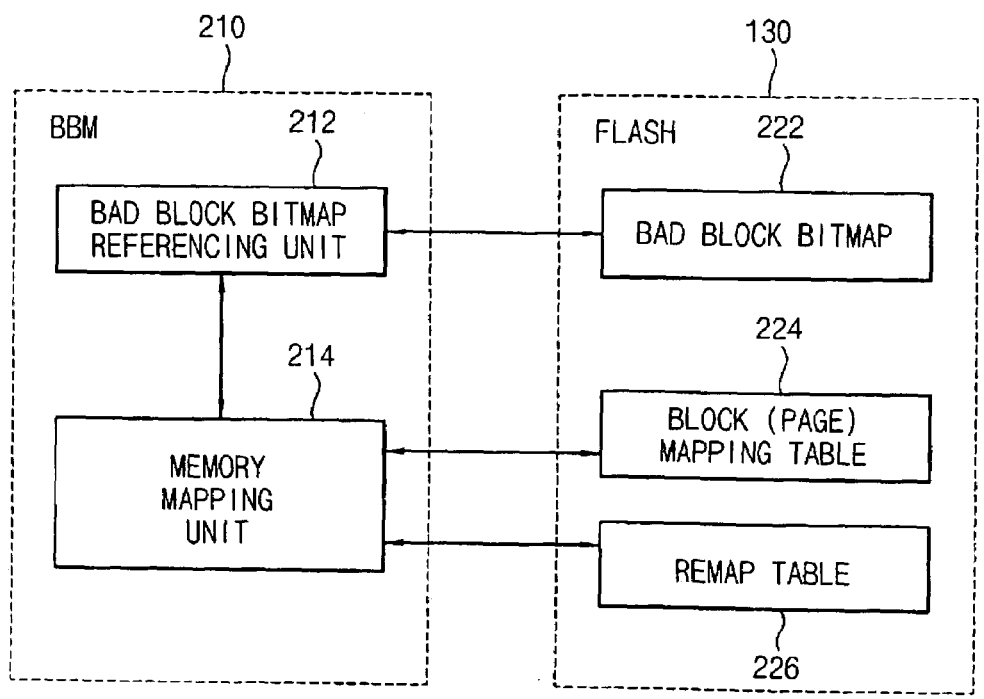
FIG. 2 is a block diagram illustrating an apparatus for controlling access to a memory device (not shown) according to another example embodiment of the present invention.

FIG. 2 is a block diagram illustrating an apparatus 210 for controlling access to a memory device (not shown) according to another example embodiment of the present invention.

In the example embodiment of FIG. 2, the apparatus 210 may include a bad block bitmap referencing unit 212 and a memory mapping unit 214. In an example, the apparatus 210 may be included within the FTL 124 of FIG. 1.

In the example embodiment of FIG. 2, the bad block bitmap referencing unit 212 may obtain bad block information (e.g., information indicating whether a particular memory block is defective) from a bad block bitmap 222 based on a logical memory address. The bad block bitmap 222 may include the bad block information of a given memory block. In an example, the given memory block may correspond to a page, which may function as a unit for performing read and write operations (e.g., an amount of data equal to the number of bits within the page may be transferred during each read/write operation).

In the example embodiment of FIG. 2, for example, the bad block bitmap referencing unit 212 may receive the logical memory address generated from the application 110, may read a bad block area corresponding to the received logical memory address from the bad block bitmap 222, and may read the bad block information corresponding to the received logical memory address from the bad block area.

In the example embodiment of FIG. 2, the bad block bitmap referencing unit 212 may read, from the bad block bitmap 212, the bad block area corresponding to a quotient equal to the received logical memory address divided by N. The read portion may correspond to a processing unit of a memory address operation. The bad block bitmap referencing unit 212 may further read, from the bad block area, the bad block information corresponding to a remainder of the received logical memory address divided by N.

In the example embodiment of FIG. 2, if the bad block information does not include a bad indication (e.g., an indication that the read bad block information is erroneous or defective), the memory mapping unit 214 may output a physical memory address corresponding to the logical memory address from the block mapping table 224. Thus, the memory mapping unit 214 may reference the block mapping table 224 to directly map the logical memory address into the physical memory address.

In the example embodiment of FIG. 2, if the bad block information includes a bad indication, the memory mapping unit 214 may obtain the physical memory address corresponding to the logical memory address from the block mapping table 224 and may search the remap table 226 for a reserved physical memory address based on the obtained physical memory address. The memory mapping unit 214 may obtain the logical address, for example, from the application 110.

Hereinafter, example operation of the apparatus 210 of FIG. 2 will be described with reference to FIGS. 3 and 4.

Figure 3:
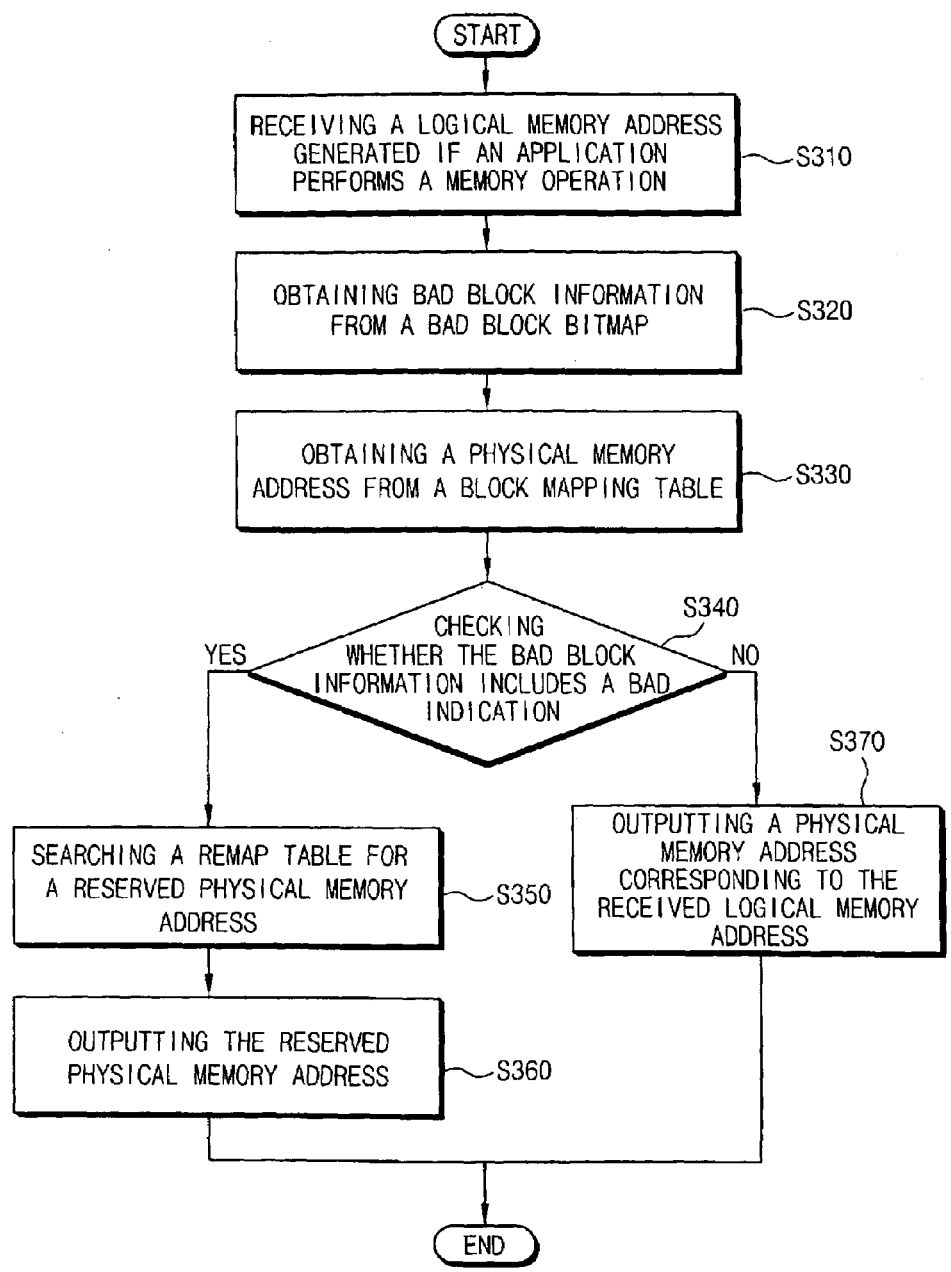
FIG. 3 is a flowchart illustrating an operation of the apparatus of FIG. 2 according to another example embodiment of the present invention.

FIG. 3 is a flowchart illustrating an operation of the apparatus 210 of FIG. 2 according to another example embodiment of the present invention.

Figure 4:
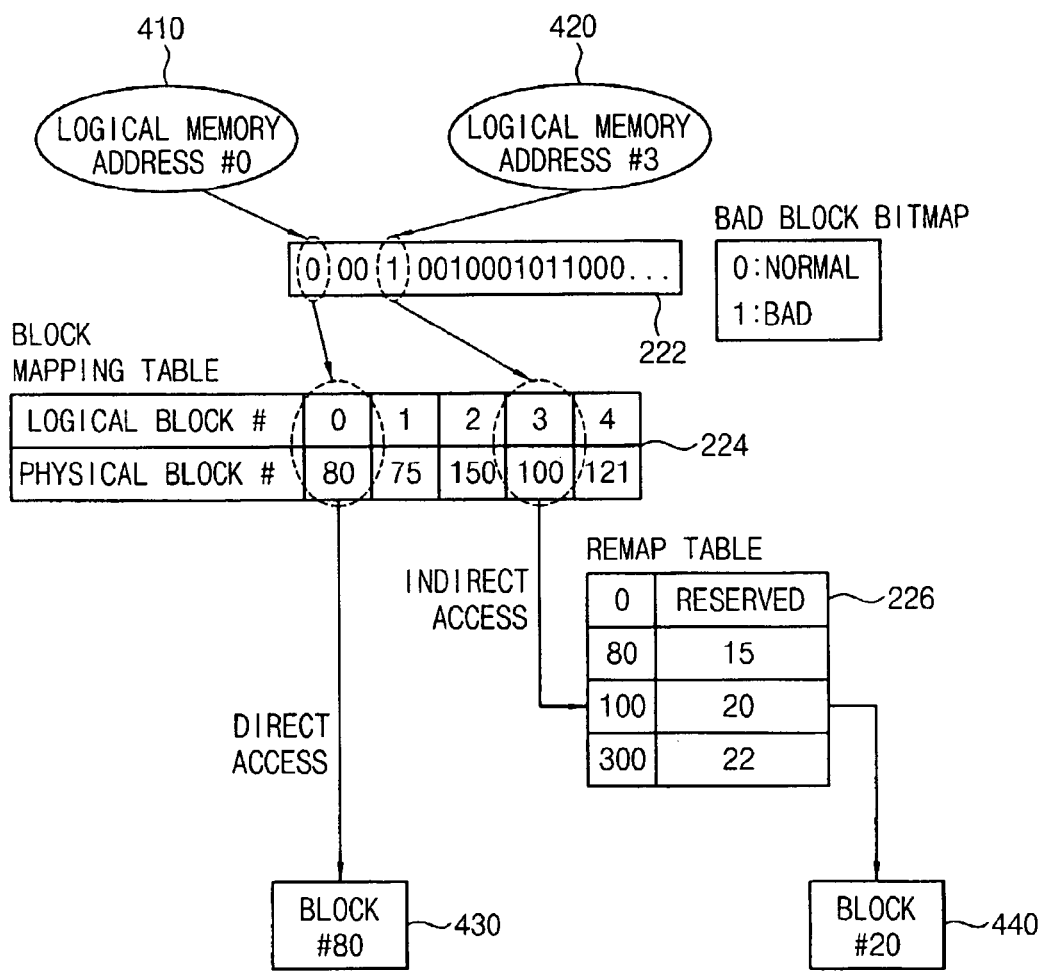
FIG. 4 is a diagram illustrating an operation of the apparatus of FIG. 2 according to another example embodiment of the present invention.

FIG. 4 is a diagram illustrating an operation of the apparatus 210 of FIG. 2 according to another example embodiment of the present invention.

In the example embodiment of FIGS. 3 and 4, the apparatus 210 may receive a logical memory address generated if the application 110 performs a memory operation (e.g., a read, write or erase operation) (at S310). For example, the logical memory address may correspond to a first logical memory address 410 or a second logical memory address 420, as illustrated in the example embodiment of FIG. 4.

In the example embodiment of FIGS. 3 and 4, the bad block bitmap referencing unit 212 may obtain bad block information corresponding to the received logical memory address from the bad block bitmap 222 (at S320). For example, if the first logical memory address 410 corresponds to logical memory address #0 as shown in FIG. 4, the bad block bitmap referencing unit 212 may obtain a $0^{th}$ bit from the bad block bitmap 222. In another example, if the second logical memory address corresponds to logical memory address #3 as shown in FIG. 4, the bad block bitmap referencing unit 212 may obtain a $3^{rd}$ bit from the bad block bitmap 222, and so on.

In the example embodiments of FIGS. 3 and 4, the memory mapping unit 214 may obtain the physical memory address corresponding to the received logical memory address from the block mapping table 224 (at S330). For example, if the second logical memory address corresponds to logical memory address #3 as shown in FIG. 4, the memory mapping unit 214 may obtain, from the memory mapping table 224, the physical memory address having a value of 100.

In the example embodiments of FIGS. 3 and 4, the memory mapping unit 214 may check whether the bad block information includes a bad indication (e.g., an indication that the read bad block information is erroneous or defective) (at S340). For example, if the bad block information includes a bad indication, the bad block information (e.g., the bad block information in the first logical memory address 410) may correspond to a first logic level (e.g., a higher logic level or logic "1"), and if the bad block information does not include a bad indication, the bad block information (e.g., the bad block information in the second logical memory address 420) may correspond to a second logic level (e.g., a lower logic level or logic "0").

In the example embodiment of FIGS. 3 and 4, the memory mapping unit 214 may search the remap table 226 for a reserved physical memory address based on the obtained physical memory address (at S350) if the bad block information includes a bad indication. For example, if the physical memory address of the second logical memory address 420 corresponds to 100 as shown in FIG. 4, the memory mapping unit 214 may search the reserved physical memory address in which a value of the physical memory address may correspond to 100.

In the example embodiments of FIGS. 3 and 4, the memory mapping unit 214 may output the reserved physical memory address, for which the remap table 226 was searched (at S360). For example, if the reserved physical memory address of the second logical memory address 420 corresponds to 20 as shown in FIG. 4, the memory mapping unit 214 may output the reserved physical memory address having a value of 20.

In the example embodiments of FIGS. 3 and 4, the memory mapping unit 214 may output the physical memory address corresponding to the received logical memory address if the bad block information does not include a bad indication (at S370). For example, if the first logical memory address corresponds to logical memory address #0, the memory mapping unit 214 may output, from the memory mapping table 224, the physical memory address having a value of 80, as shown in FIG. 4.

Figure 5A:
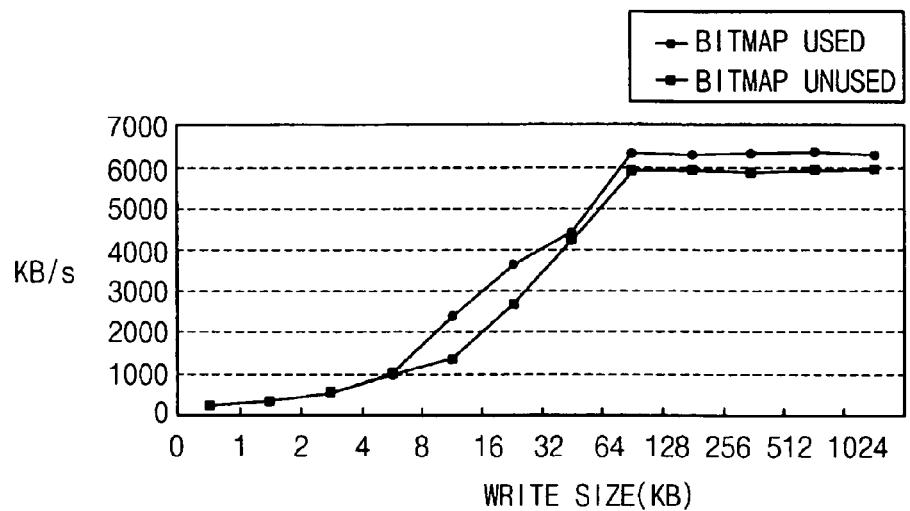
FIG. 5A is a graph illustrating a performance of a write operation by a flash memory device controller according to another example embodiment of the present invention.

FIG. 5A is a graph illustrating a performance of a write operation by a flash memory device controller according to another example embodiment of the present invention.

Figure 5B:
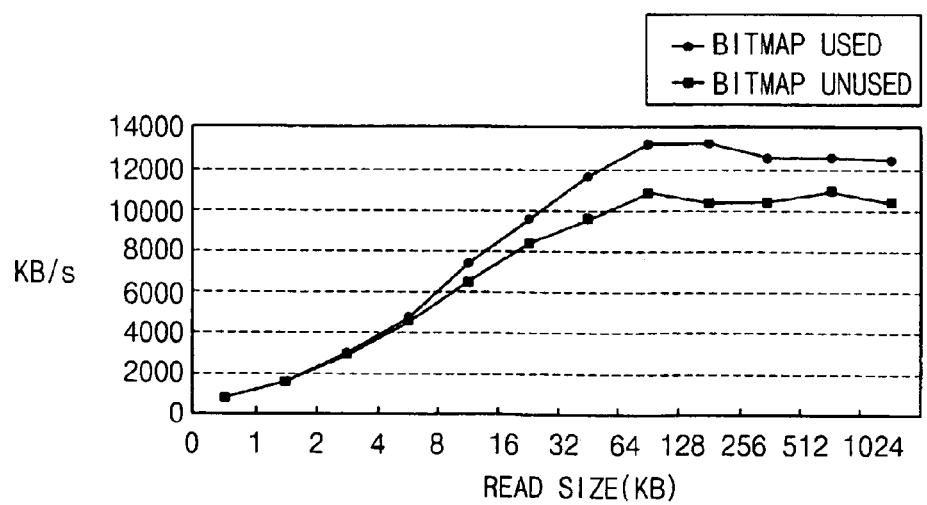
FIG. 5B is a graph illustrating a performance of a read operation by the flash memory device controller according to another example embodiment of the present invention.

FIG. 5B is a graph illustrating a performance of a read operation by the flash memory device controller according to another example embodiment of the present invention.

In the example embodiments of FIGS. 5A and 5B, the performance of the write operation may be improved by about 6%, and the performance of the read operation may be improved by about 15%, in comparison with a conventional system that does not employ the bad block bitmap in accordance with example embodiments of the present invention.

Figure 6:
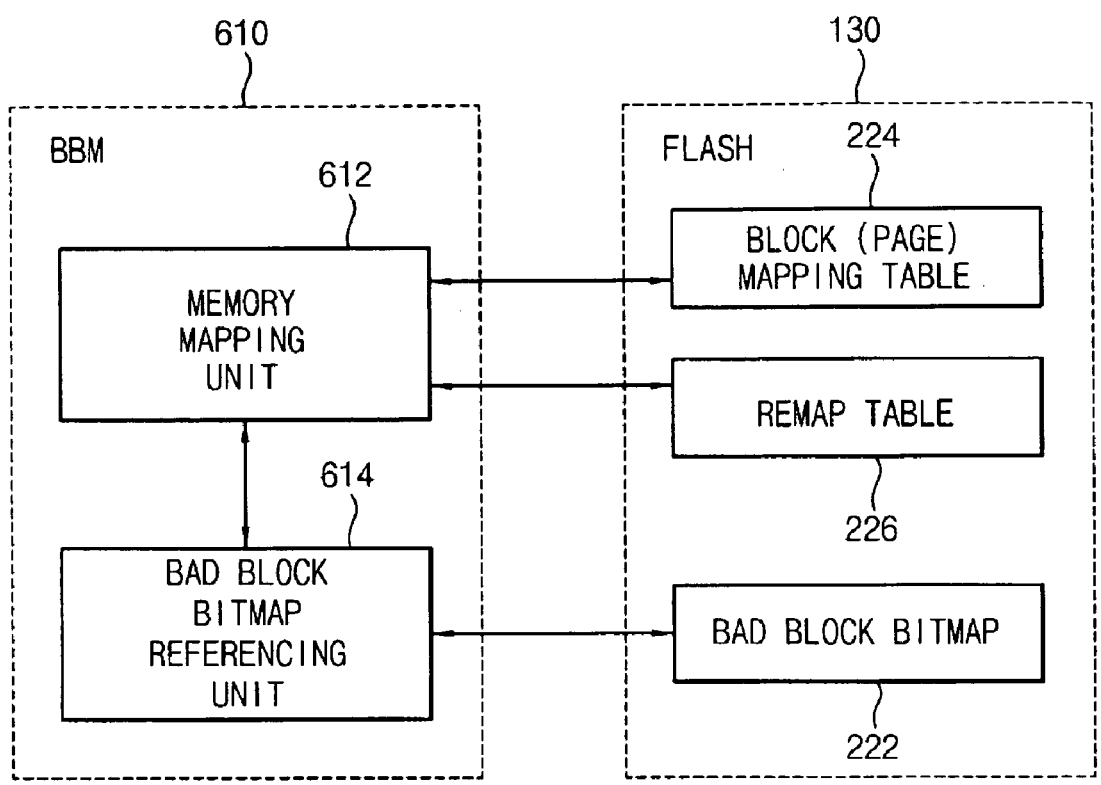
FIG. 6 is a block diagram illustrating an apparatus of controlling access to a memory device according to another example embodiment of the present invention.

FIG. 6 is a block diagram illustrating an apparatus 610 of controlling access to a memory device according to another example embodiment of the present invention.

In the example embodiment of FIG. 6, in an example, apparatus 610 may be included within the FTL 124 of FIG. 1. The apparatus 610 may include a memory mapping unit 612 and a bad block bitmap referencing unit 614.

In the example embodiment of FIG. 6, the bad block bitmap referencing unit 614 may obtain bad block information from the bad block bitmap 222 based on a physical memory address. The bad block bitmap 222 may include the bad block information of a memory block and the bad block information may indicate whether or not the memory block corresponds to a bad block. For example, the bad block bitmap referencing unit 614 may read, from the bad block bitmap 212, a bad block area corresponding to a quotient equal to the obtained physical memory address divided by N. The read bad block area portion may correspond to a processing unit of a memory address operation. The bad block bitmap referencing unit 614 may also read, from the bad block area, the bad block information corresponding to a remainder of the obtained physical memory address divided by N.

In the example embodiment of FIG. 6, the memory mapping unit 612 may obtain the physical memory address corresponding to a received logical memory address, and may search the remap table 226 for a reserved physical memory address if the bad block information corresponding to the obtained physical memory address includes a bad indication. Alternatively, the memory mapping unit 612 may output the physical memory address if the bad block information does not include a bad indication. Thus, the memory mapping unit 612 may receive the logical memory address (e.g., from the application 110), and may obtain, from the block mapping table 224, the physical memory address based on the received logical memory address. The bad block bitmap referencing unit 614 may obtain, from the bad block bitmap 222, the bad block information based on the obtained physical memory address.

In the example embodiment of FIG. 6, if the bad block information corresponding to the obtained physical memory address includes a bad indication, the memory mapping unit 612 may search the remap table 226 for the reserved physical memory address based on the obtained physical memory address, and may output the reserved physical memory address corresponding to the physical memory address.

Hereinafter, example operation of the apparatus 610 will be described with reference to FIGS. 7 and 8.

Figure 7:
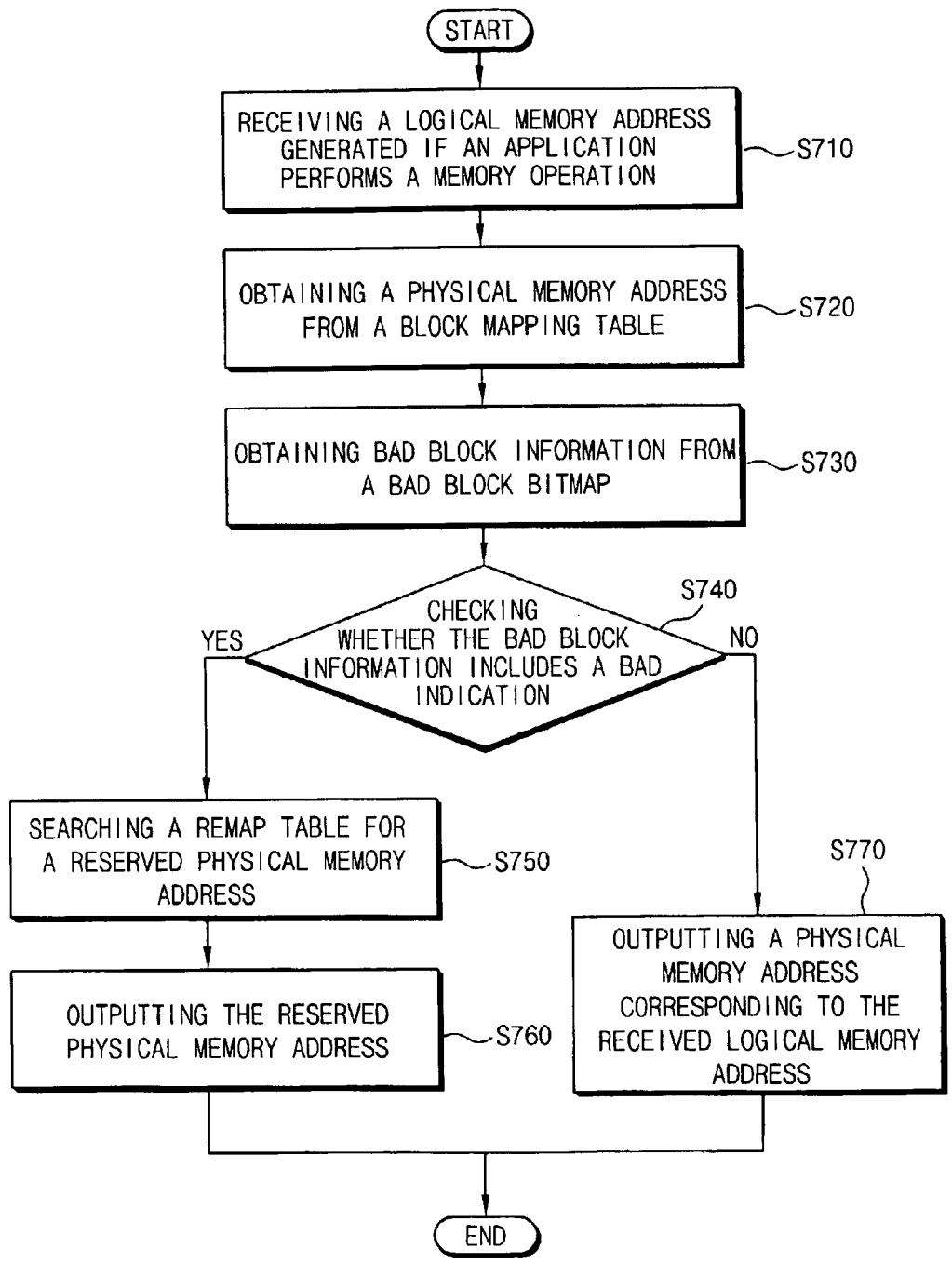
FIG. 7 is a flowchart illustrating an operation of the apparatus of FIG. 6 according to another example embodiment of the present invention.

FIG. 7 is a flowchart illustrating an operation of the apparatus 610 of FIG. 6 according to another example embodiment of the present invention.

Figure 8:
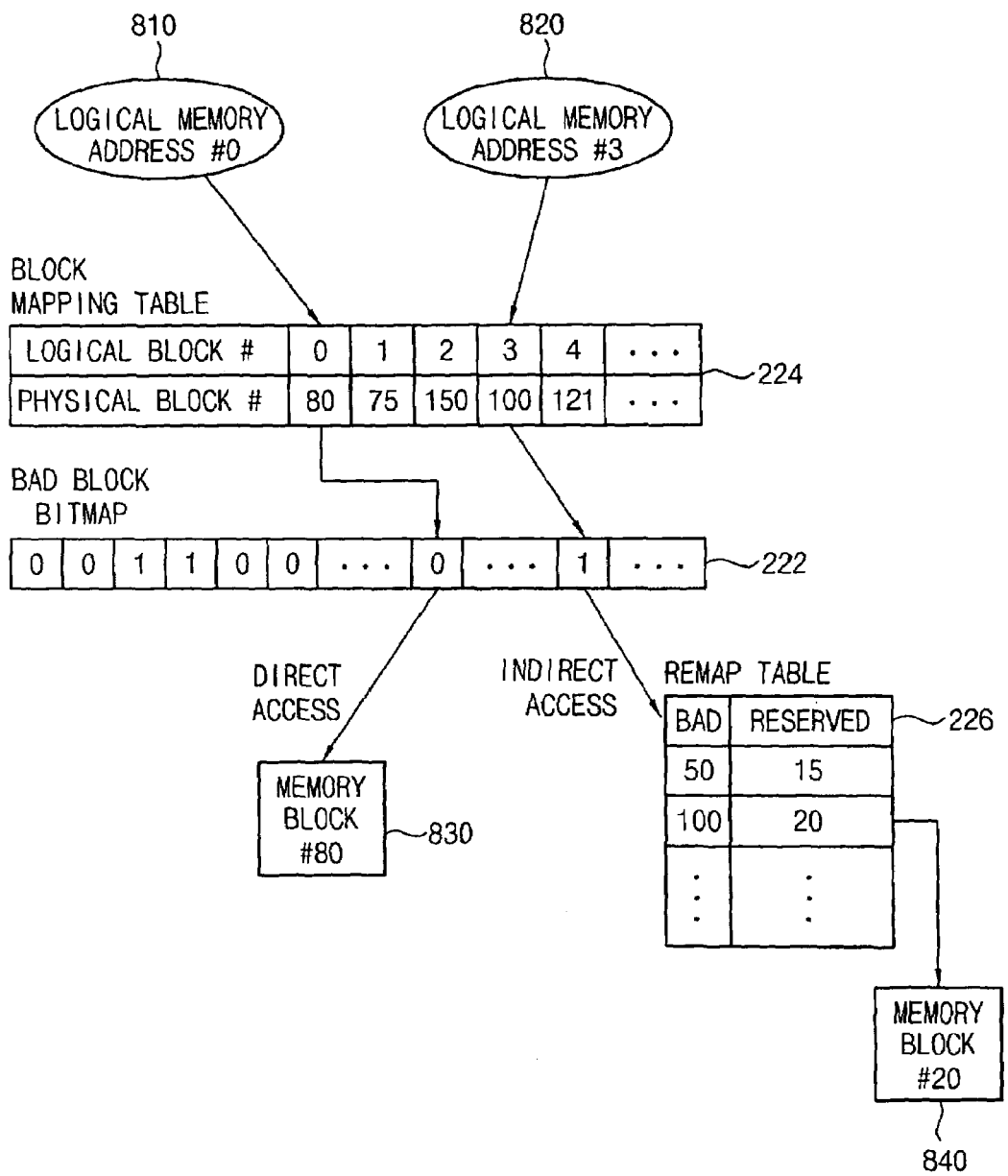
FIG. 8 is a diagram illustrating an operation of the apparatus of FIG. 6 according to another example embodiment of the present invention.

FIG. 8 is a diagram illustrating an operation of the apparatus 610 of FIG. 6 according to another example embodiment of the present invention.

In the example embodiments of FIGS. 7 and 8, the apparatus 610 may receive the logical memory address generated if the application 110 performs a memory operation (e.g., a read, write or erase operation) (at S710). For example, the logical memory address may correspond to a third logical memory address 810 or a fourth logical memory address 820 illustrated in FIG. 8.

In the example embodiments of FIGS. 7 and 8, the memory mapping unit 612 may obtain, from the block mapping table 224, a physical memory address corresponding to the received logical memory address (at S720). For example, if the third logical memory address 810 corresponds to logical memory address #0, the memory mapping unit 612 may obtain the physical memory address having a value of 80, as shown in FIG. 8. In another example, if the fourth logical memory address 820 corresponds to logical memory address #3, the memory mapping unit 612 may obtain the physical memory address having a value of 100, as shown in FIG. 8.

In the example embodiments of FIGS. 7 and 8, the bad block bitmap referencing unit 614 may obtain, from the bad block bitmap 222, the bad block information corresponding to the obtained physical memory address (at S730). For example, if the physical memory address corresponding to the third logical memory address 810 has value of 80, the bad block bitmap referencing unit 614 may obtain an $80^{th}$ bit from the bad block bitmap 222. In another example, if the physical memory address corresponding to the fourth logical memory address 820 has a value of 100, the bad block bitmap referencing unit 614 may obtain a $100^{th}$ bit from the bad block bitmap 222, and so on.

In the example embodiments of FIGS. 7 and 8, the memory mapping unit 612 may check whether the bad block information includes a bad indication (at S740). For example, if the bad block information includes a bad indication, the bad block information (e.g., the bad block information in the third logical memory address 810) may correspond to the first logic level (e.g., a higher logic level or logic "1"), and, alternatively, if the bad block information does not include a bad indication, the bad block information (e.g., the bad block information in the fourth logical memory address 820) may correspond to the second logic level (e.g., a lower logic level or logic "0").

In the example embodiments of FIGS. 7 and 8, if the bad block information indicates a bad block, the memory mapping unit 612 may search the remap table 226 for the reserved physical memory address corresponding to the obtained physical memory address (at S750). For example, if the physical memory address of the fourth logical memory address 820 corresponds to 100 as shown in FIG. 8, the memory mapping unit 612 may search the remap table 226 for the reserved physical memory address in which the physical memory address of the reserved physical memory address corresponds to 100.

In the example embodiments of FIGS. 7 and 8, the memory mapping unit 612 may output the reserved physical memory address corresponding to the physical memory address (at S760). For example, if the reserved physical memory address of the fourth logical memory address 820 corresponds to 20 as shown in FIG. 8, the memory mapping unit 612 may output the reserved physical memory address having a value of 20.

In the example embodiments of FIGS. 7 and 8, the memory mapping unit 612 may output the physical memory address corresponding to the received logical memory address if the bad block information does not include a bad indication (at S770). For example, if the third logical memory address 810 has a value of 0 as shown in FIG. 8, the memory mapping unit 612 may output the physical memory address having a value of 80.

In another example embodiment of the present invention, an apparatus for controlling access to a memory device may translate a logical memory address into a physical memory address based on a bad block bitmap.

Example embodiments of the present invention being thus described, it will be obvious that the same may be varied in many ways. For example, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Further, while above-described example embodiments of the present invention are related to flash memory devices, it is understood that other example embodiments of the present invention may be directed to any well-known type of memory device.

Such variations are not to be regarded as a departure from the spirit and scope of example embodiments of the present invention, and all such modifications as would be obvious to one skilled in the art are intended to be included within the scope of the following claims.

What is claimed is:

1. A method for controlling a memory device, comprising:
   receiving a logical memory address from outside of the memory device;
   obtaining a physical memory address corresponding to a logical memory address;
   obtaining bad block information from a bad block bitmap based on a given memory address, the given memory address being one of the logical memory address and the physical memory address, the bad block information indicating whether a given memory block corresponding to the given memory address is a bad block; and
   obtaining a reserved physical memory address corresponding to the physical memory address if the bad block information indicates that the given memory block is a bad block,
   wherein obtaining the bad block information includes
      receiving the logical memory address;
      reading data from a bad block area corresponding to the received logical memory address within the bad block bitmap; and
      reading the bad block information corresponding to the received logical memory address from the bad block area,
   wherein reading the bad block area includes reading, from the bad block bitmap, the bad block area corresponding to a quotient equal to the received logical memory address divided by a number N, the number N equal to a number of bits within a processing unit of a memory address operation, and wherein reading the bad block information includes reading, from the bad block area, the bad block information corresponding to a remainder of the received logical memory address divided by the number N.

2. The method of claim 1, further comprising:

outputting the physical memory address corresponding to the logical memory address if the bad block information indicates that the given memory block is not a bad block; and outputting the reserved physical memory address corresponding to the physical memory address if the bad block information indicates that the given memory block is a bad block.

3. The method of claim 1, wherein the physical memory address corresponding to the logical memory address is obtained from a block mapping table, and wherein the reserved physical memory address corresponding to the physical memory address is obtained by searching a remap table.

4. The method of claim 1, wherein the memory device includes a flash memory device.

5. The method of claim 1, wherein the given memory address is the physical memory address corresponding to the logical memory address.

6. The method of claim 1, wherein the given memory address is the logical memory address.

7. An apparatus for controlling a memory device, comprising:

a bad block bitmap referencing unit configured to obtain bad block information from a bad block bitmap based on a given memory address, the given memory address being one of a logical memory address received from outside of the memory device and a physical memory address corresponding to the logical memory address, the bad block information indicating whether a given memory block corresponding to the given memory address is a bad block; and a memory mapping unit configured to obtain the physical memory address corresponding to the logical memory address, and configured to obtain a reserved physical memory address corresponding to the physical memory address if the bad block information indicates that the given memory block is a bad block, wherein the bad block bitmap referencing unit is configured to receive the logical memory address, read data from a bad block area corresponding to the received logical memory address within the bad block bitmap and read the bad block information corresponding to the received logical memory address from the bad block area, and wherein the bad block bitmap referencing unit is configured to read, from the bad block bitmap, the bad block area corresponding to a quotient equal to the received logical memory address divided by a number N, the number N equal to a number of bits within a processing unit of a memory address operation, and is further configured to read, from the bad block area, the bad block information corresponding to a remainder of the received logical memory address divided by the number N.

8. The apparatus of claim 7, wherein the memory mapping unit outputs the physical memory address corresponding to the logical memory address if the bad block information indicates that the given memory block is not a bad block and outputs the reserved physical memory address corresponding to the physical memory address if the bad block information indicates that the given memory block is a bad block.

9. The apparatus of claim 7, wherein the physical memory address corresponding to the logical memory address is obtained from a block mapping table, and wherein the reserved physical memory address corresponding to the physical memory address is obtained by searching a remap table.

10. The apparatus of claim 7, wherein the memory device includes a flash memory device.

11. The apparatus of claim 7, wherein the apparatus is a memory device controller.

12. The apparatus of claim 11, wherein the memory device controller includes a flash translation layer (FTL).

* * * * *